United States Patent
Ma et al.

(10) Patent No.: US 7,275,950 B1
(45) Date of Patent: Oct. 2, 2007

(54) ELECTRICAL CONNECTOR HAVING A SECURING MEMBER FOR PREVENTING AXIAL SLIDING OF A LEVER

(75) Inventors: Hao-Yun Ma, Tu-Cheng (TW); Robert G. McHugh, Golden, CO (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/509,534

(22) Filed: Aug. 24, 2006

(51) Int. Cl.
*H01R 4/50* (2006.01)
*H01R 13/625* (2006.01)

(52) U.S. Cl. .................................. 439/342; 439/70
(58) Field of Classification Search ............... 439/342, 439/331, 70
See application file for complete search history.

(56) References Cited

U.S. PATENT DOCUMENTS

| | | | |
|---|---|---|---|
| 5,611,705 A * | 3/1997 | Pfaff ........................ | 439/266 |
| 5,616,044 A * | 4/1997 | Tsai ........................ | 439/342 |
| 6,758,691 B1 * | 7/2004 | McHugh et al. ........... | 439/331 |
| 6,769,928 B2 * | 8/2004 | Chang ........................ | 439/342 |
| 6,780,041 B1 * | 8/2004 | Ma ............................ | 439/342 |
| 6,827,587 B2 * | 12/2004 | Ma ............................ | 439/73 |
| 7,097,464 B1 * | 8/2006 | McHugh et al. ........... | 439/73 |
| 7,121,845 B2 * | 10/2006 | Liao et al. .................... | 439/73 |
| 7,182,619 B2 * | 2/2007 | Hsu ............................ | 439/331 |
| 7,189,094 B2 * | 3/2007 | Ma ............................ | 439/331 |
| 2006/0105608 A1 * | 5/2006 | Ma ............................ | 439/331 |
| 2006/0166542 A1 * | 7/2006 | Hsu ............................ | 439/331 |

* cited by examiner

*Primary Examiner*—Hae Moon Hyeon
(74) *Attorney, Agent, or Firm*—Wei Te Chung

(57) ABSTRACT

An electrical connector (2) comprises an housing (2), a plurality terminals (21) received in the housing (2), a stiffener (3) engaged with the housing (2), a clip (5) and a lever (6) pivotably mounted on two opposite sides of the stiffener (3) and a securing member (7). When the securing member (7) is assembled on the lever (6), the barbs of the securing member (7) engages interferentially with outer surface of one end of the lever (6), thus the lever (6) is reliably secured on the stiffener, and the mechanical connection of the electrical connector is achieved.

13 Claims, 6 Drawing Sheets

ELECTRICAL CONNECTOR HAVING A SECURING MEMBER FOR PREVENTING AXIAL SLIDING OF A LEVER

BACKGROUND OF THE INVENTION

1. Field of the Invention

The present invention relates to the art of electrical connectors, and more particularly to an electrical connector provided for mechanically and electrically connecting a chip module to a printed circuit board (PCB).

2. Description of the Prior Art

Electrical connectors are widely used in the connector industry for electrically connecting a chip module to a printed circuit board (PCB) in personal computer. Conventionally, an electrical connector mainly comprises an insulative housing, a multiplicity of terminals received therein, a load plate and a lever pivotably mounted on two opposite sides of the housing.

Referring to FIGS. 6 and 7, a conventional electrical connector 10' comprises an insulative housing 20', a plurality of terminals received in corresponding passageways of the housing 20', a metal stiffener 30' partly covering and reinforcing the housing 20', a metal clip 50 pivotably attached to an end of the stiffener 30', and a lever 60' pivotably mounted to an opposite end of the stiffener 30' for engaging with the lever 60'.

The housing 20' defines a multiplicity of passageways in a rectangular array, for interferentially receiving corresponding terminals.

The lever 60' comprises a pair of locating portions 624' pivotably received in the chamber 322' of the stiffener 30', an offset actuating portion 622' between the locating portions 624', and an operating portion 63' extending perpendicularly from an end of one of the locating portions 624'. The operating portion 63' is disposed outside of the stiffener 30'.

The stiffener 30' is substantially rectangular and comprises a pair of lateral sides 36' each having a substantially L-shaped cross-section, a left end 32' having an U-shaped cross-section, and a right end 34' having an L-shaped cross-section. The housing 20' is fittingly received in the stiffener 30'. The U-shaped cross-section comprises a pair of stopper 322' extending therefrom and an anchoring portion 324' disposed on one stopper 322' for locating the locating portion 624' of the lever 60'.

When the electrical connector 10' is assembled, the anchoring portion 324' of the stiffener 30' secures the offset actuating portion 622' of the lever 60' which can prevent the lever 60' from moving in a lengthwise direction of the U-shaped cross-section. However, the anchoring portion 324' is always configured as a thin member, which abuts against the offset actuating portion 622' only with a small surface. When a user open or close the electrical connector 10', the anchoring portion 324' might be bent or broken by an unfittingly power applied on the operation portion 63' of the lever 60'. As a result, it is prone to destroy the electrical and mechanical connection of the electrical connector 10'.

Thus, there is a need to provide an electrical connector that overcomes the above-mentioned problems.

SUMMARY OF THE INVENTION

Accordingly, an object of the present invention is to provide an electrical connector able to ensure a stable and reliable mechanical and electrical connection between the chip module and the printed circuit board.

To fulfill the above-mentioned object, an electrical connector in accordance with the preferred embodiment comprises an insulative housing, a plurality terminals received in the housing, a stiffener engaged with the housing, a clip and a lever pivotably mounted on two opposite sides of the stiffener and a securing member engaging with the locating portion of the lever. The lever comprises a pair of locating portions pivotably received in the stiffener, an offset actuating portion between the locating portions, and an operating portion extending perpendicularly from an end of the locating portions. The securing member is hollow-shaped and comprises an inner wall and a plurality of barbs extending arcuately from the inner wall in a same direction. When the securing member is assembled on the lever, the barbs of the securing member is disposed far from the actuating portion and engages interferentially with outer surface of the lever, thus the lever is reliably secured on the stiffener and the mechanical connection of the electrical connector is achieved.

Relative to the present technology, the electrical connector in accordance with the prefer embodiment of the invention defines a securing member for engaging with the locating portion of the lever and the securing member comprises a plurality of barbs abutting against outer surface of the locating portion, thereby the lever can be stably located and the mechanical and electrical connection between the electrical connector and printed circuit board can be attained.

Other objects, advantages and novel features of the present invention will become more apparent from the following destoppered description when taken in conjunction with the accompanying drawings, in which:

DESCRIPTION OF PREFERRED EMBODIMENT OF THE INVENTION

Reference will now be made to the drawings to describe the present invention in destopper.

Figure 1:
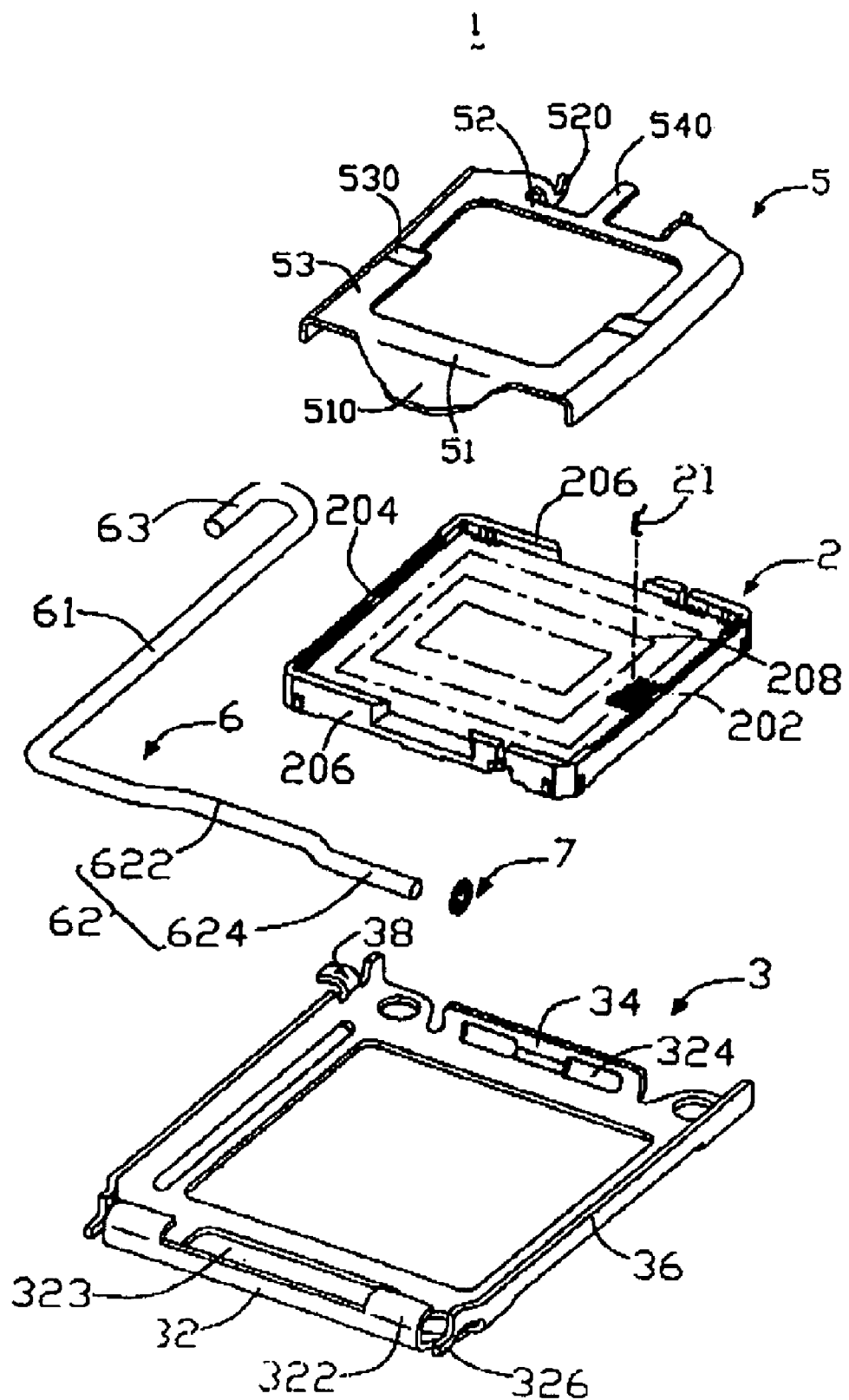
FIG. 1 is an exploded, isometric view of an electrical connector in accordance with a preferred embodiment of the present invention.

FIG. 1 is an exploded, isometric view of an electrical connector 1 in accordance with a preferred embodiment of the present invention. The electrical connector 1 provided for electrically connecting a chip module (not shown) to a PCB (not shown) includes an a generally rectangular insulative housing 2, a multiplicity of terminals 21 received in the housing 2, a metal stiffener 3 partly covering and reinforcing the housing 2, a lever 6 pivotably attached to an end of the stiffener 3, a metal clip 5 pivotably mounted to an opposite end of the stiffener 3 for engaging with the lever 6 and a securing member 7 engaging with an end of the lever 6.

Figure 2:
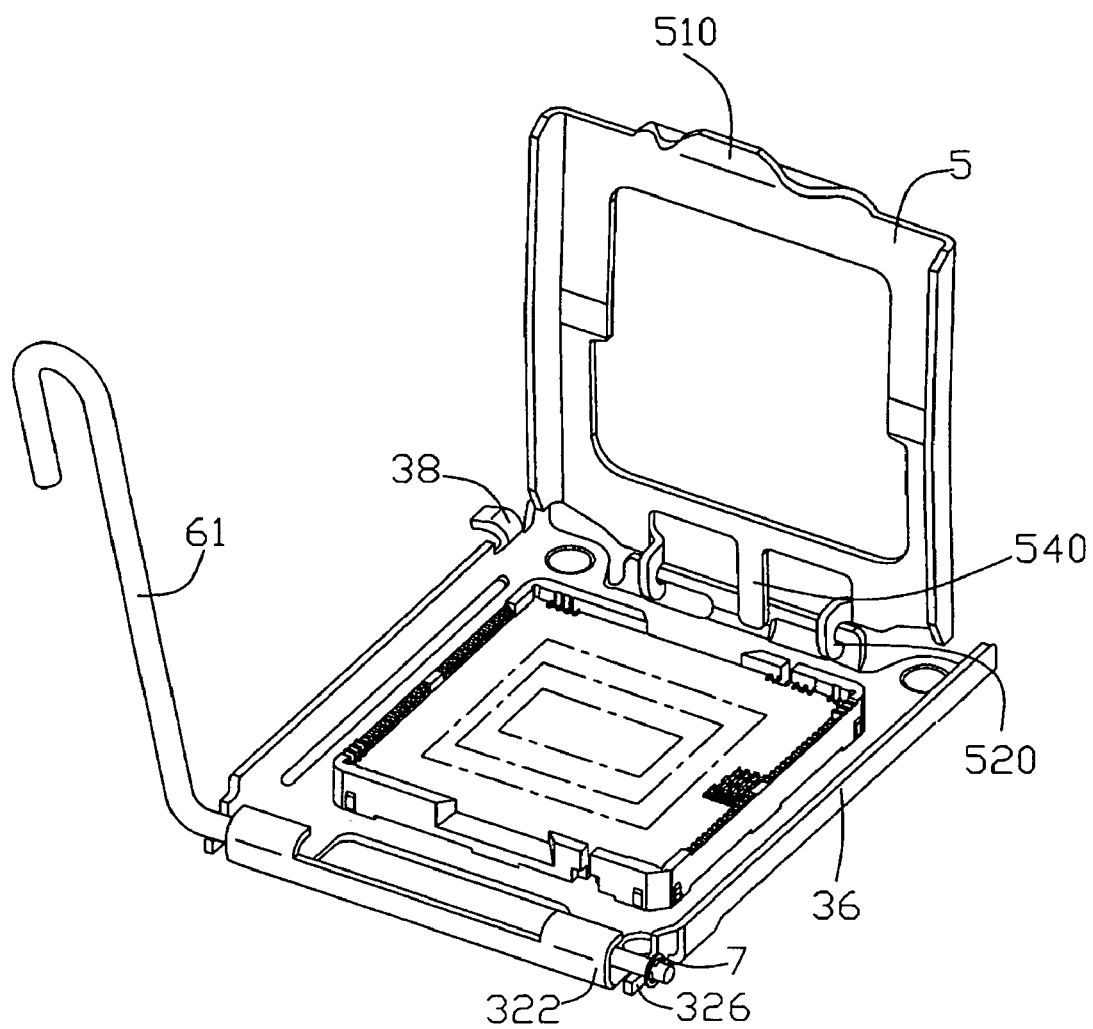
FIG. 2 is an assembled, isometric view of the electrical connector shown in FIG. 1, wherein the clip is open.
Figure 3:
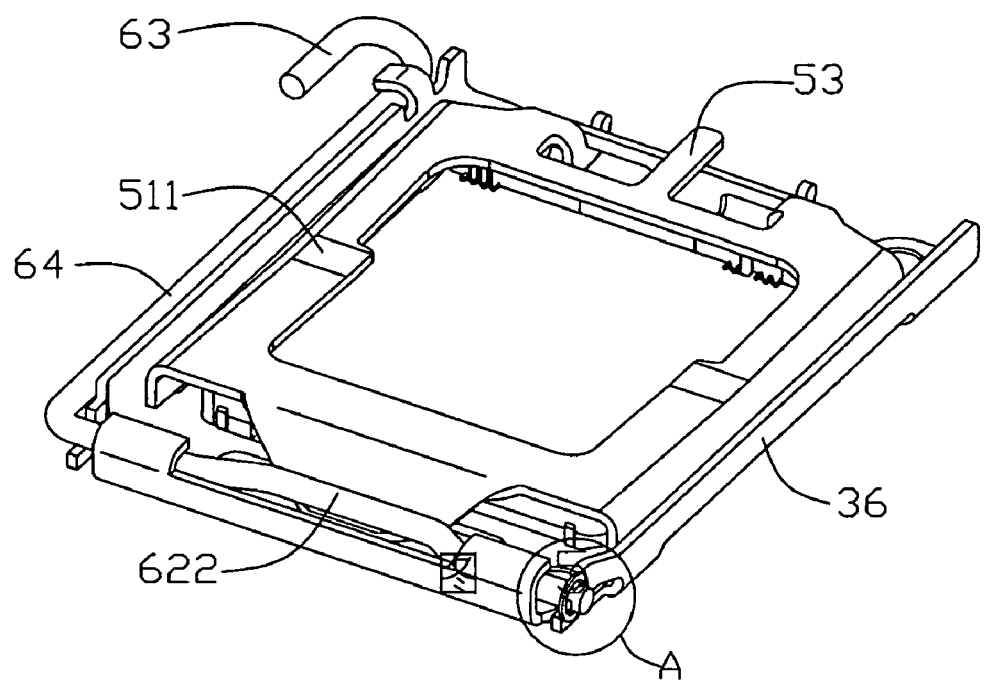
FIG. 3 is an assembled, isometric view of the electrical connector shown in FIG. 1.

Referring to FIGS. 1-2, the housing 2 includes a first sidewall 202, a second sidewall 204 opposite to the first sidewall 202 and two opposite third sidewalls 206 adjacent the first and second sidewalls 202, 204 respectively. The four sidewalls cooperatively define a generally rectangular cavity 208 in a middle section thereof for receiving the chip module therein. A multiplicity of passages is defined in a portion of the housing 2 under the cavity 208, for receiving a corresponding number of the terminals 21 therein respectively.

Referring to FIG. 2, the stiffener 3 is substantially rectangular and comprises a pair of lateral sides 36 each having a substantially L-shaped cross-section, a left end 32 having a U-shaped cross-section, and a right end 34 having an L-shaped cross-section, wherein one of the lateral side 36 defines a bending section 326 for receiving the securing member 7, the other lateral side defines a locking hook 38 for engaging with lever 6, and the left end 32 defines a pair of securing chambers 322 for engaging with the locating portions 624 of the lever 6. In addition, the right end 34 defines a pair of slots 324 for receiving the securing portion 520 of the clip 5.

Referring to FIG. 2, the lever 6 includes a connecting portion, a pair of locating portions 624 pivotably received in the chambers 322 of the stiffener 3, an offset actuating portion 622 between the locating portions 323, and an operating portion 63 extending perpendicularly from an end of one of the connecting portions 61. The operating portion 63 is disposed outside of the stiffener 3. When oriented at a horizontal position parallel to the housing 2, the operating portion 63 engages with the locking hook 38 on the stiffener 3.

Referring to FIG. 2, the clip 5 has a first side 51, a second side 52 opposite to the first side 51 and two opposite third slant sides 53 adjacent the first and second sides 51, 52 respectively. The third sides 53 are bent toward the housing 2 and each of the third sides 53 defines a pressing portion 530 bent toward the housing 2 in a middle portion thereof. An engaging portion 510 is extended arcuately from an outside of the first side 51 thereof. A pair of spaced securing portions 520 is extended arcuately from the second side 52 thereof and pivotably received in the slots 324 of the stiffener 30, and a stopper 540 formed between the securing portions 520. When the clip 5 is oriented at a horizontal position parallel to the housing 2, the engaging portion 510 of the clip 5 engages with the actuating portion 622 of the lever 6, thereby the driving actuating portion 622 to press the chip module on the terminals 21. When the clip 5 is oriented at a vertical position perpendicular to the housing 2, the stopper 540 abuts against the stiffener 3 to prevent the clip 5 from being over-rotated.

Figure 4:
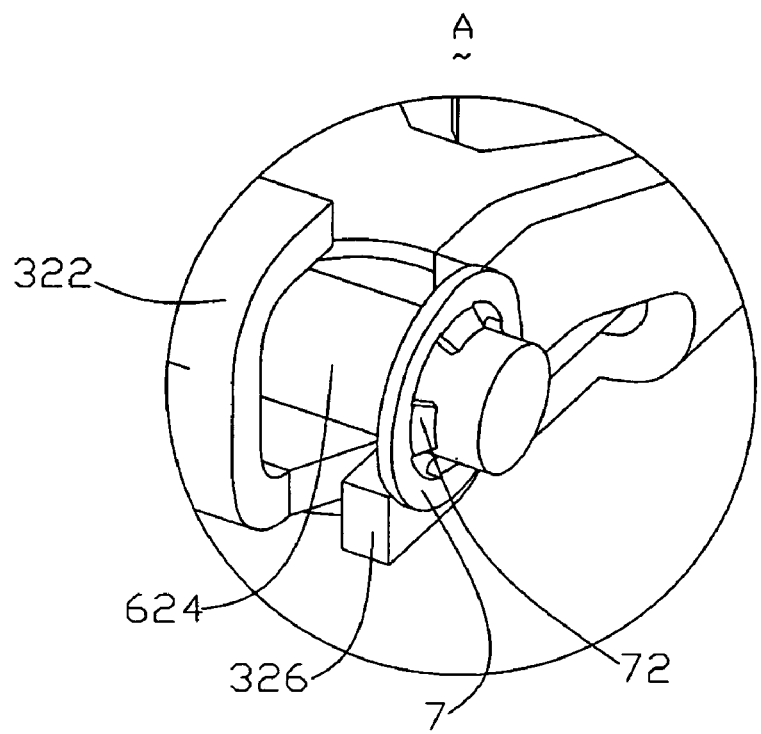
FIG. 4 an enlarged view of a circle A in the housing shown in FIG. 2.
Figure 5:
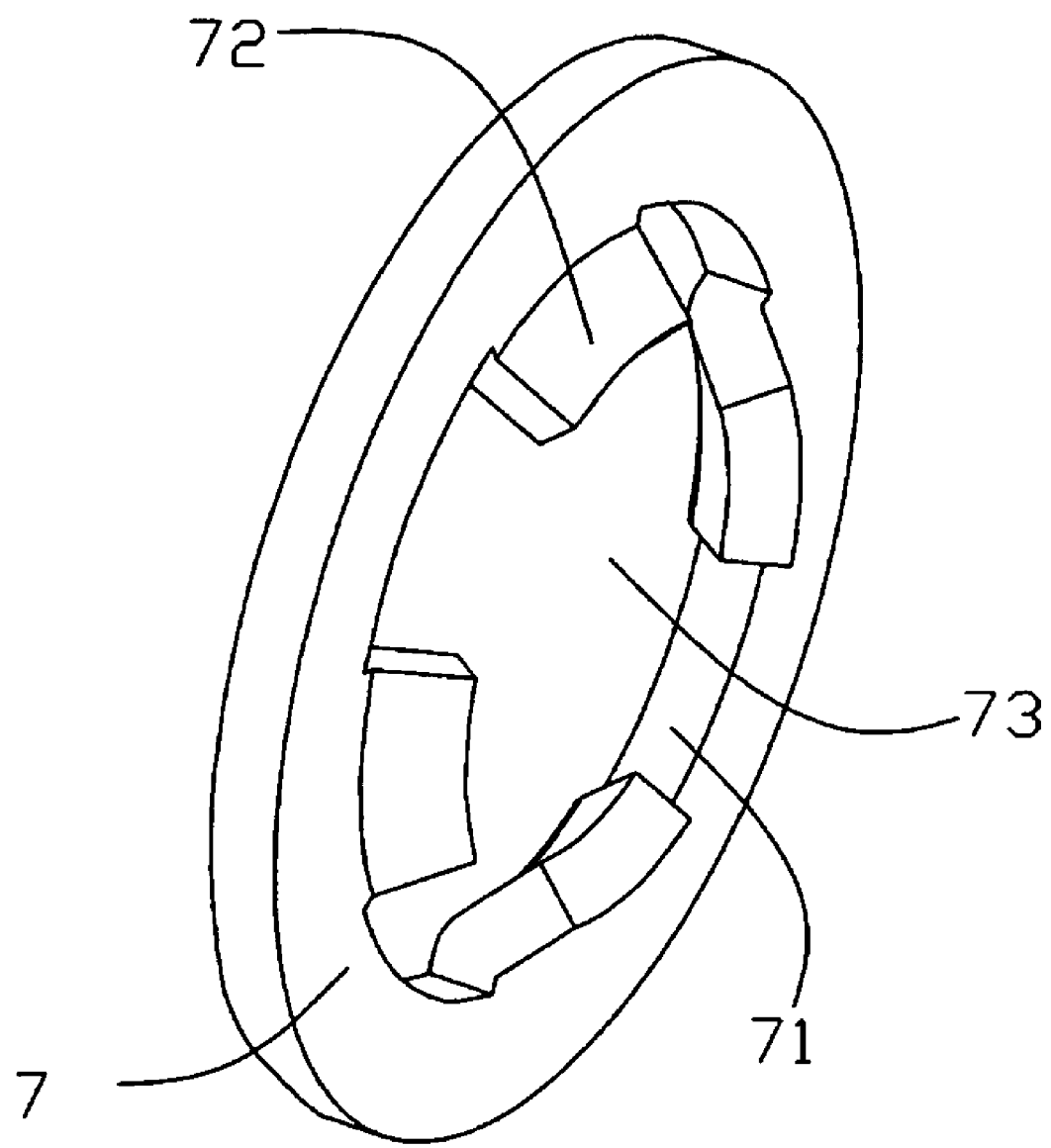
FIG. 5 an enlarged, isometric view of the securing member shown in FIG. 3.
Figure 6:
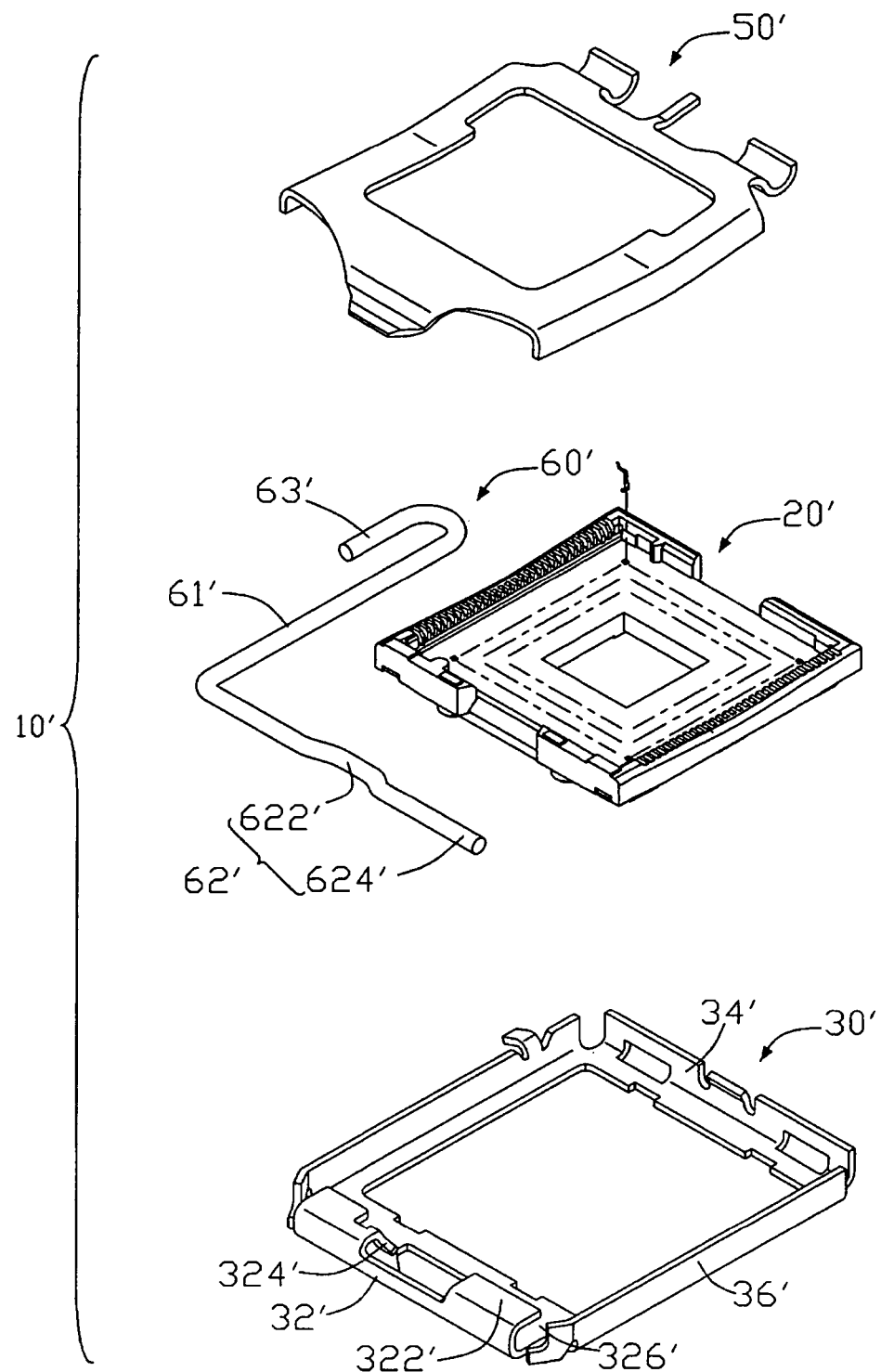
FIG. 6 is an exploded, isometric view of a conventional electrical connector.
Figure 7:
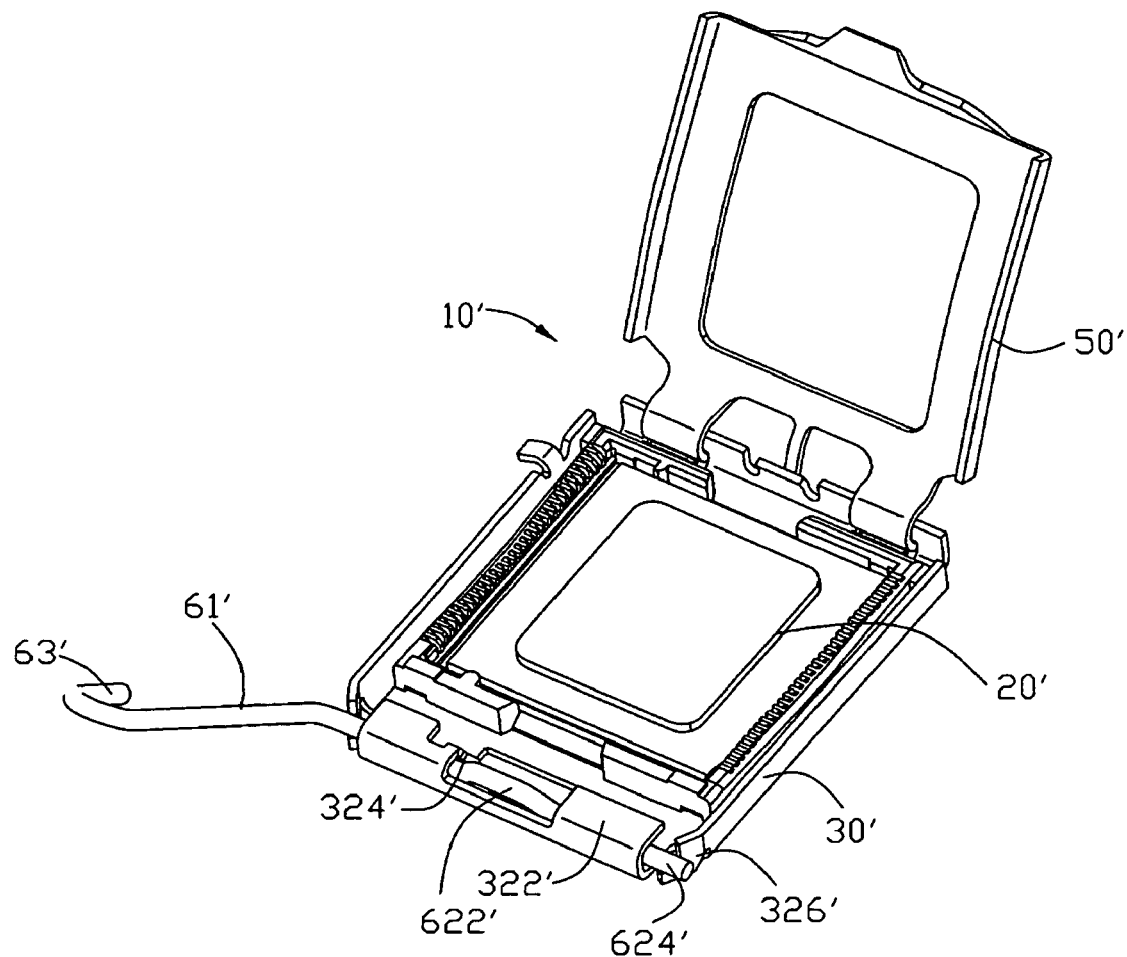
FIG. 7 is an assembled, isometric view of the electrical connector shown in FIG. 6, wherein the clip is open.

Referring to FIGS. 4-5, the hollow shaped securing member 7 is always defined as circular structure and defines an inner wall 71 and a plurality of barbs 72 for engaging with locating portion 624 of the lever 6 extending arcuately from the inner wall 71 in the same direction. Each barb 72 defines an arcuately outer wall. The barbs are configured as curved shape and cooperatively define a receiving hole 73 having an inner diameter slightly greater than the outer diameter of the lever 6 for interferentially engaging with the lever 6.

Referring to FIGS. 1-5, when the electrical connector 1 is assembled, the securing member 7 is mounted on an end of the locating portion 624 and the barbs 72 of the securing member 7 abuts against outer surface of the locating portion 624 and the barbs 72 is bent far from the offset actuating portion 622. When a user opens or closes the electrical connector 1, the barbs 72 of the securing member 7 can prevent the lever 6 from moving. So the barbs 72 defined on the securing member 7 can ensure a reliably position to the lever 6 of the electrical connection 1. As a result, the stability and reliability of the electrical connector 1 is attainted.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical connector comprising:
    an insulative housing;
    a plurality of electrical terminals received in the housing;
    a stiffener for partly covering and reinforcing the housing;
    a lever pivotably attached in an end of the stiffener;
    a clip pivotably engaging with one end of the stiffener;
    a securing member mounted on an end of the lever for preventing the lever axially sliding relative to the stiffener;
    wherein the securing member includes a base with a window, a plurality of barbs extending from the base into the window and defining an opening which is narrower than an outer diameter of the lever.

2. The electrical connector as claimed in claim 1, wherein each barb defines a curved outer surface corresponding to an outer surface of the lever.

3. The electrical connector as claimed in claim 1, wherein the outer surfaces of the barbs cooperatively form an enveloping space having a slightly greater inner diameter than the outer diameter of the lever.

4. The electrical connector as claimed in claim 2, wherein the stiffener comprises a pair of first lateral sides each having a substantially L-shaped cross-section, a left end having a U-shaped cross-section, and a right end having an L-shaped cross-section.

5. The electrical connector as claimed in claim 4, wherein the clip comprises two second opposite slant sides connecting with the first sides and defines a pressing portion in a middle portion of the second side.

6. The electrical connector as claimed in claim 4, wherein slots are defined in the right end for receiving the securing portions of the clip, and a pair of hook extends arcuately from an edge of one of the lateral sides.

7. An electrical connector comprising:
    an insulative housing;
    a plurality of electrical terminals received in the housing;
    a stiffener for partly covering and reinforcing the housing;
    a L-shaped lever pivotably attached in an end of the stiffener and defining a horizontal actuation section engageable with the clip;
    a clip pivotably mounted to an opposite end of the stiffener;
    a securing member mounted on a free end of said horizontal actuation section;
    wherein the securing member defined as a hollow structure with an inner wall and a number of barbs extending arcuately from the inner wall for engaging with the lever.

8. The electrical connector as claimed in claim 7, wherein the actuation section defines and offset segment in a middle portion for engagement with the clip.

9. The electrical connector as claimed in claim 7, wherein said offset segment is not restrained by the stiffener from moving along an axial direction of said horizontal actuation section.

10. The electrical connector as claimed in claim 7, wherein said securing member for restraining movement of said horizontal actuation section along an axial direction of said horizontal actuation section is located at said free end of said horizontal actuation section rather than a middle portion.

11. The electrical connector as claimed in claim 7, wherein said securing member is a ring.

12. The electrical connector as claimed in claim 7, wherein the securing member abuts against a side wall of the stiffener.

13. An electrical connector comprising:
an insulative housing;
a plurality of electrical terminals received in the housing;
a stiffener for partly covering and reinforcing the housing;
a clip pivotably mounted to one end of the stiffener;
an L-shaped lever pivotably attached in an opposite end of the stiffener and defining a horizontal actuation section engageable with the clip; and
a securing member mounted on a free end of said horizontal actuation section; wherein
the securing member is synchronically rotated along with the lever; wherein
the securing member for restraining movement of the horizontal actuation section along an axial direction of the horizontal actuation section is located at said free end of said horizontal actuation section rather than a middle portion.

* * * * *